(12) United States Patent
Chang

(10) Patent No.: US 6,803,806 B2
(45) Date of Patent: Oct. 12, 2004

(54) CIRCUIT AND METHOD FOR A CIRCUIT OF SELECTING REFERENCE VOLTAGE

(75) Inventor: Chuan-Jen Chang, Hsinchu Shien (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/383,642

(22) Filed: Mar. 10, 2003

(65) Prior Publication Data

US 2004/0178842 A1 Sep. 16, 2004

(51) Int. Cl.[7] .................................................. H03K 3/01
(52) U.S. Cl. ........................................ 327/534; 327/407
(58) Field of Search ............................. 327/77, 88, 89, 327/407, 408, 409, 410, 530, 534, 535

(56) References Cited

U.S. PATENT DOCUMENTS 6,566,935 B1 * 5/2003 Renous ........................ 327/408

* cited by examiner

Primary Examiner—Jeffrey Zweizig
(74) Attorney, Agent, or Firm—Birch, Stewart, Kolasch & Birch, LLP

(57) ABSTRACT

Different reference voltages are employed in different logical electrical circuits. In the conventional arts, a reference voltage circuit is only employed in a specific logical electrical circuit or a reference voltage circuit with fuse can changes a reference voltage by fusing the fuse. Nevertheless, the reference voltage circuit with fuse is still only employed in a specific system of logical circuit regardless of the fuse is fused or unfused. A select reference voltage circuit for a logical electrical system of the present invention can solve the problem. Therefore, the select reference voltage method for a logical electrical system can be employed in different systems having respective different system voltages.

21 Claims, 5 Drawing Sheets

CIRCUIT AND METHOD FOR A CIRCUIT OF SELECTING REFERENCE VOLTAGE

BACKGROUND OF THE INVENTION

1. Field of the Invention

This invention relates to a circuit of selecting reference voltage, and more particularly to employ a compare circuit to decide a state of an input signal, and a reference voltage select circuit selects a suitable voltage according to the state of the input signal.

2. Description of the Prior Art

A dynamic random access memory (DRAM) decides upon a logical signal of an input signal according to a voltage of the input signal. When a system outputs a logical signal "1", a voltage of the logical signal "1" is an input high voltage $V_{IH}$; when the system outputs a logical signal "0", a voltage of the logical signal "0" is an input low voltage $V_{IL}$.

In some applications, for example, a low power synchronous dynamic random access memory (LPSD), a signal voltage is an input high voltage or an input low voltage that is determined by a system voltage. If a ratio of the signal voltage and the system voltage is larger than 0.8, the signal voltage is determined as the input high voltage $V_{IH}$, and if the ratio of the signal voltage and the system voltage is smaller than 0.2, the signal voltage is determined as the input low voltage $V_{IL}$. In the DRAM, a logical signal is the input high voltage $V_{IH}$ or the input low voltage $V_{IL}$, that is determined according to a reference voltage $V_{REF}$, it is determined voltage that. If the input signal is higher than the reference voltage $V_{REF}$, it is determined as "1"; and if the input signal is lower than the reference voltage $V_{REF}$, it is determined as "0". In general, the reference voltage $V_{REF}$ is an average of the input high voltage $V_{IH}$ and the input low voltage $V_{IL}$ for determining the logical signal under an optimum state due to a toleration for a variation resulting from a noise being equal between the input high voltage $V_{IH}$ and the input low voltage $V_{IL}$.

Different systems have respective different system voltages and so the input high voltage $V_{IH}$, the input low voltage $V_{IL}$ and the reference voltage $V_{REF}$ are changed according to the system voltage. For example, a system voltage of first system is 2.5V, an input high voltage $V_{IH}$ thereof is 2.0V, an input low voltage $V_{IL}$ thereof is 0.5V and a reference voltage $V_{REF}$ is 1.25V; a system voltage of second system is 1.8V, an input high voltage $V_{IH}$ thereof is 1.44V, an input low voltage $V_{IL}$ thereof is 0.36V and a reference voltage $V_{REF}$ is 0.9V. Therefore, a design of a different reference voltage is needed for suiting to a different system. In the conventional arts, a reference voltage circuit with a fuse can change a reference voltage of the circuit. For example, if the fuse is unfused, the reference voltage provided by the circuit is suitable for the first system voltage 2.5V, and if the fuse is fused, the reference voltage provided by the circuit is suitable for the second system voltage 1.8V. But the circuit needs an extra process of fusing the fuse to change the reference voltage thereof and further the circuit only suits with the system voltage 1.8V when the fuse is fused.

Hence, aimed at the aforementioned problem of the conventional arts, the present invention employs a design of a select reference voltage circuit to select different reference voltages for suiting with different systems having different system voltages.

SUMMARY OF THE INVENTION

In the conventional arts, a reference voltage circuit is only applied in a system having a special system voltage, or the reference voltage circuit with a fuse needs the extra process of fusing the fuse and the circuit only suits with a system having a special system voltage regardless of the fuse is fused or unfused. It is an objective for present invention to provide a select reference voltage circuit for a logical electrical system to select a suitable reference voltage according to a system voltage.

It is another objective for present invention to employ a select reference voltage circuit for a logical electrical system to determine a state of a system voltage, and a reference voltage select circuit can select a suitable reference voltage according to the state.

It is a still another objective for present invention to provide a select reference voltage circuit for a logical electrical system to determine a suitable reference voltage for a logical system only during a short time after the logical system turns on. Hence, the determined reference voltage is not changed under an unstable system voltage.

It is another objective for present invention to provide a select reference voltage circuit for a logical electrical system that turns off after a suitable reference voltage is determined for economizing on consumption power.

As aforementioned, the present invention provides a select reference voltage circuit for a logical electrical system comprising a compare circuit and a reference voltage select circuit. The compare circuit receives both a system voltage and a base voltage of a logical electrical system and compares the system voltage with the base voltage to output a compare signal. The reference voltage select circuit receives the compare signal and selects a reference voltage coupling with the compare signal to output to the logical electrical system. Therefore, the device can select a suitable reference voltage for a different logical electrical system to output. A square wave generate circuit is further employed to receive a turn-on signal from the logical electrical system and generate a pulse signal. The compare circuit and the reference select circuit turn off when receive a turn-off signal of the pulse signal dropping down for avoiding changing the determined reference voltage due to a unstable system voltage. Moreover, a consumption power of the circuit can be efficiently economized.

DESCRIPTION OF THE PREFERRED EMBODIMENT

Some sample embodiments of the invention will now be described in greater detail. Nevertheless, it should be recognized that present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

Figure 1A:
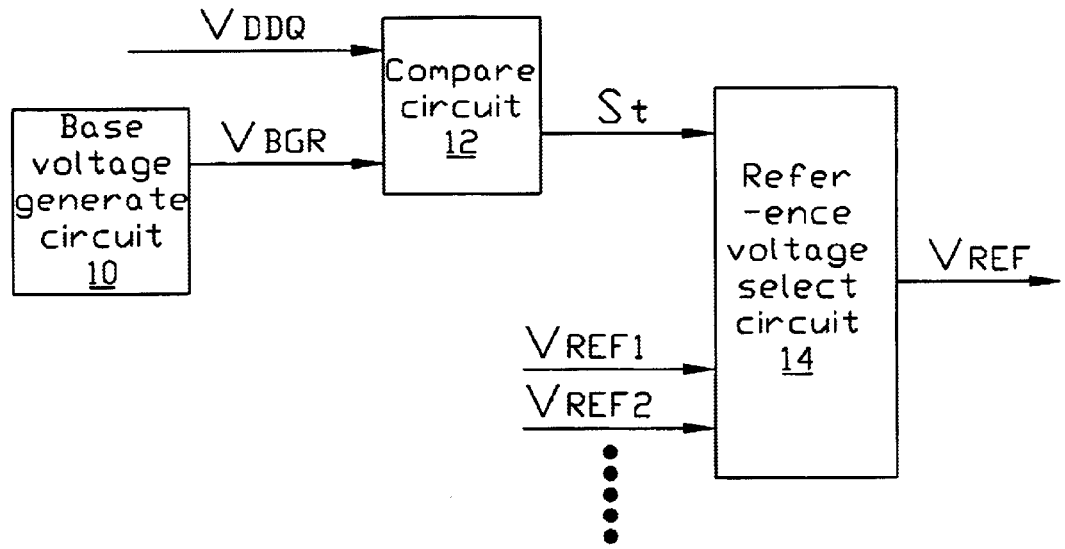
FIG. 1A to FIG. 1D are diagrams of a circuit apparatus of one preferred embodiment in the present invention.
Figure 1B:
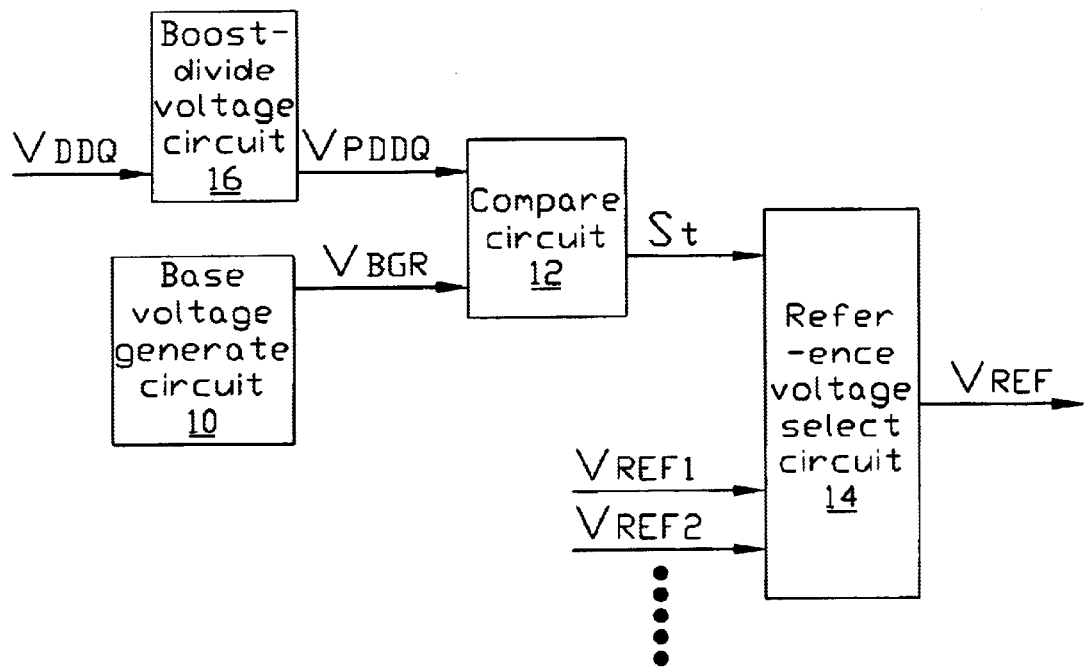
Figure 1C:
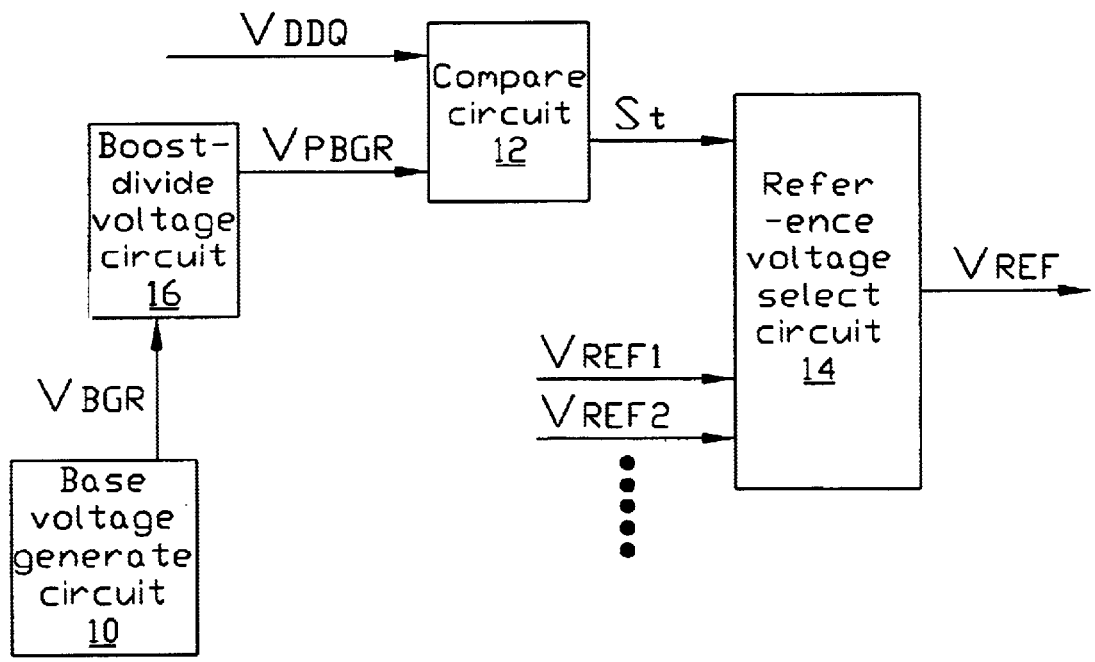
Figure 1D:
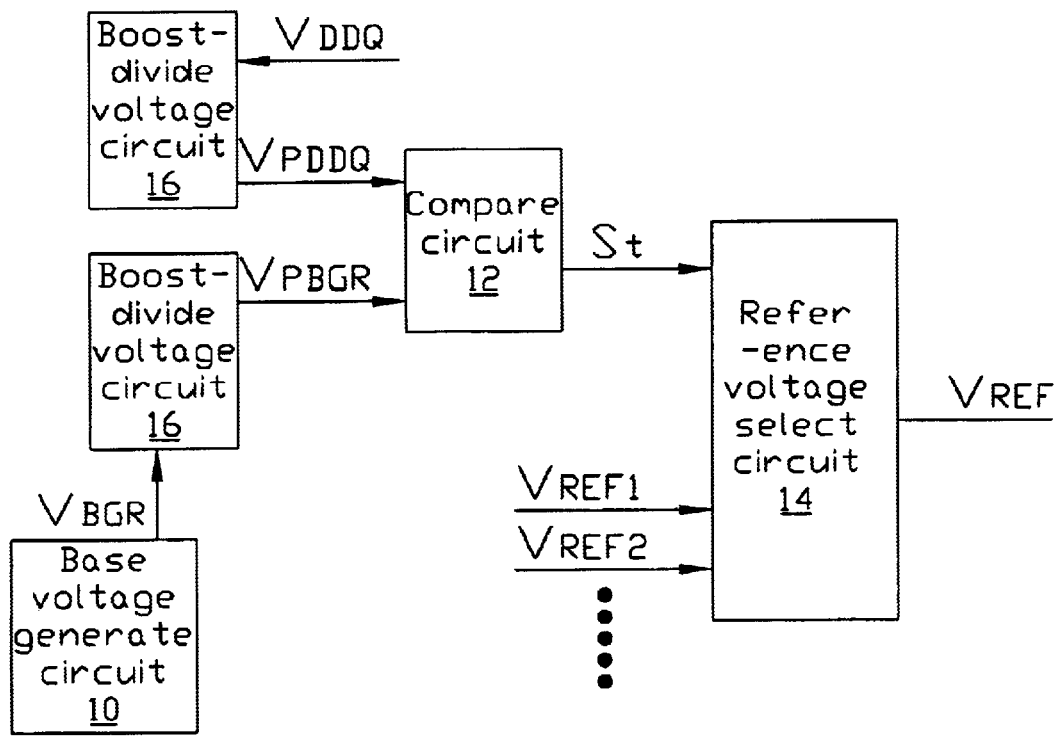
Figure 2A:
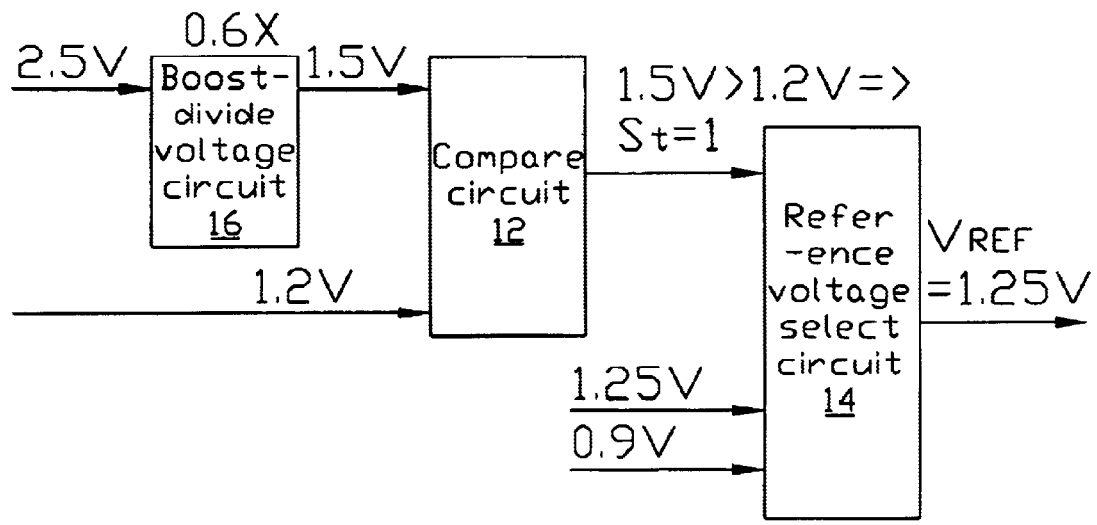
FIG. 2A to FIG. 2B are diagrams of operating example of one preferred embodiment in the present invention.
Figure 2B:
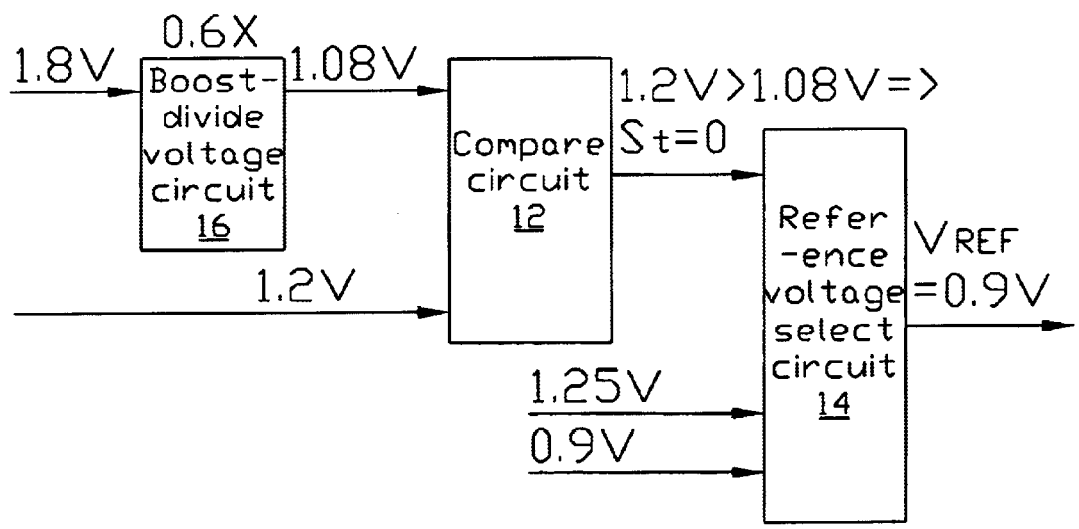

One preferred embodiment of the present invention employs a base voltage generate circuit, e.g.: a base voltage is 1.2V in a DRAM design, as a stable voltage source such as a pair of voltage source for avoiding effects of temperature, etc,. as shown in FIG. 1A. A base voltage generate circuit 10 generates a base voltage $V_{BGR}$. A compare circuit 12 compares a system voltage $V_{DDQ}$ with the base voltage $V_{BGR}$ to output a compare signal St. A reference voltage select circuit 14 receives a plurality of reference voltages and determines a reference voltage $V_{REF}$ according to the compare signal St to output. One of the base voltage $V_{BGR}$ and the system voltage $V_{DDQ}$ can connects with a boost-divide voltage circuit 16 or both thereof connect with respective boost-divide voltage circuits 16 to change the base voltage $V_{BGR}$ into $V_{pBGR}$ or change the system voltage $V_{DDQ}$ into $V_{pDDQ}$. The compare circuit 12 compares $V_{pBGR}$ with $V_{DDQ}$, $V_{BGR}$ with $V_{pDDQ}$, or $V_{pBGR}$ with $V_{pDD}$, and outputs a compare signal St, as shown in FIG. 1B, FIG. 1C and FIG. 1D. For example, a base voltage is 1.2V; first system voltage $V_{DDQ}$ is 2.5V; second system voltage $V_{DDQ}$ is 1.8V. The system voltages connect with a boost-divide voltage circuit 16 for diminishing the voltage to become 0.6 times of the original voltages. Therefore, the voltages of the first system and the second system change into 1.5V and 1.08V respectively. If the base voltage is lower than a system voltage, the compare signal St is 1; if the base voltage is higher than a system voltage, the compare signal St is 0. Hence, if the system voltage is 2.5V, the compare signal St of the compare circuit is 1, and the system voltage is 1.8V, the compare signal St of the compare circuit is 0. A base voltage is preferably a average of both system voltage by means of a boost-divide voltage circuits 16 with a suitable times and so the voltage differences between the base voltage and both system voltages are equal. The reference voltage select circuit receives both reference voltages $V_{REF1}$, and $V_{REF2}$ coupling with both system voltages, i.e.: first reference voltage $V_{REF1}$ is 1.25V and second reference voltage $V_{REF2}$ is 0.9V. If the reference voltage select circuit 14 receives a compare signal St being 1, the reference voltage select circuit 14 selects the first reference voltage $V_{REF1}$ as the reference voltage $V_{REF}$. If the reference voltage select circuit 14 receives a compare signal St being 0, the reference voltage select circuit 14 selects the second reference voltage $V_{REF2}$ as the reference voltage $V_{REF}$, as shown in FIG. 2A and FIG. 2B.

For different logical electrical systems, a select reference voltage circuit for a logical electrical system of the present invention has different reference voltages coupling with the different logical electrical systems. The select reference circuit for a logical electrical system is assembled in a logical electrical system. When the system turns on, the select reference circuit determines a reference voltage suiting to the system according to the aforementioned process. Furthermore, if the system need a reference voltage changing according to an external condition when the system turns on every time, the select reference circuit of the present invention can provide a reference voltage suiting to the system every time. Moreover, a range of the reference voltage that provided by the select reference voltage circuit to a logical electrical system is between a maximum voltage of the select reference voltage circuit and a minimum voltage thereof. For example, the reference voltages that can be provided by the select reference voltage circuit are 1.2V, 1.8V and 2.5V. The range of the reference voltage is 1.2V to 2.5V. If a most preferable reference voltage for a system is 1.7V, the select reference voltage circuit selects a reference voltage nearest to most preferable reference voltage, i.e.: 1.8V, to output. Hence, the select reference voltage circuit can be assembled in a system that needs a reference voltage is between a maximum reference voltage of the select reference voltage circuit and a minimum voltage thereof. For example, a personal computer can provide system voltages of 0V, 1.75V, 2.5V, 3.3V, 5V, 12V, etc, and the system voltages is provided in a reference voltage select circuit of the select reference voltage circuit as a reference voltage source, therefore, the range of the reference voltage is 0V to 12V. Compared with a single reference voltage circuit or a reference voltage circuit with fuse in the conventional arts, the select reference voltage circuit can output a different reference voltage for suiting to a different reference voltage of demand. For example, a reference voltage circuit with a fuse, a output reference voltage is 1.25V when the fuse is unfused and a output voltage is 0.9V when the fuse is fused. Therefore the reference voltage circuit with a fuse only outputs 1.25V when the fuse is unfused and can not work in a system with a reference voltage of 0.9V, or only outputs 0.9V when the fuse is fused and can not work in a system with a reference voltage of 1.25V. However, the select reference voltage circuit of the present invention does not have the aforementioned problem.

Figure 3A:
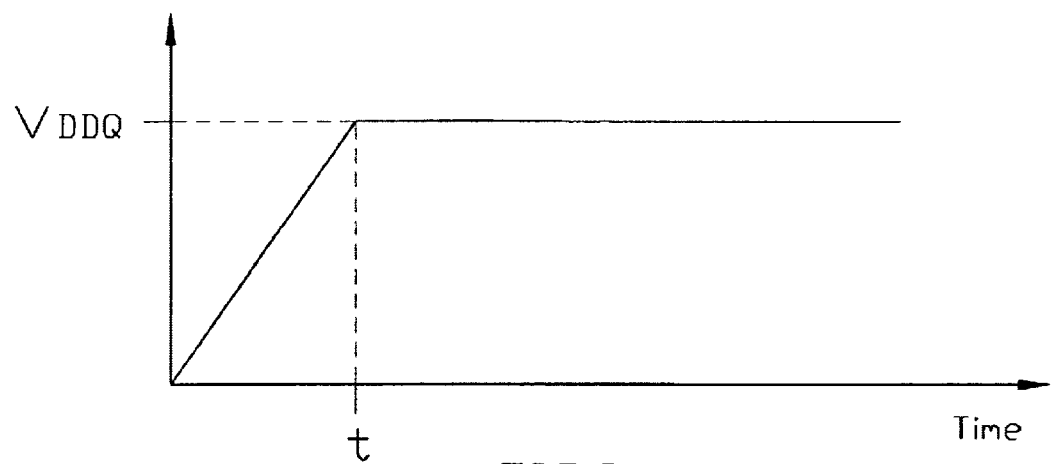
FIG. 3A to FIG. 3C are diagrams of timing relation of a square wave generate circuit, a system turn-on signal and a system turn-on ready signal.
Figure 3B:
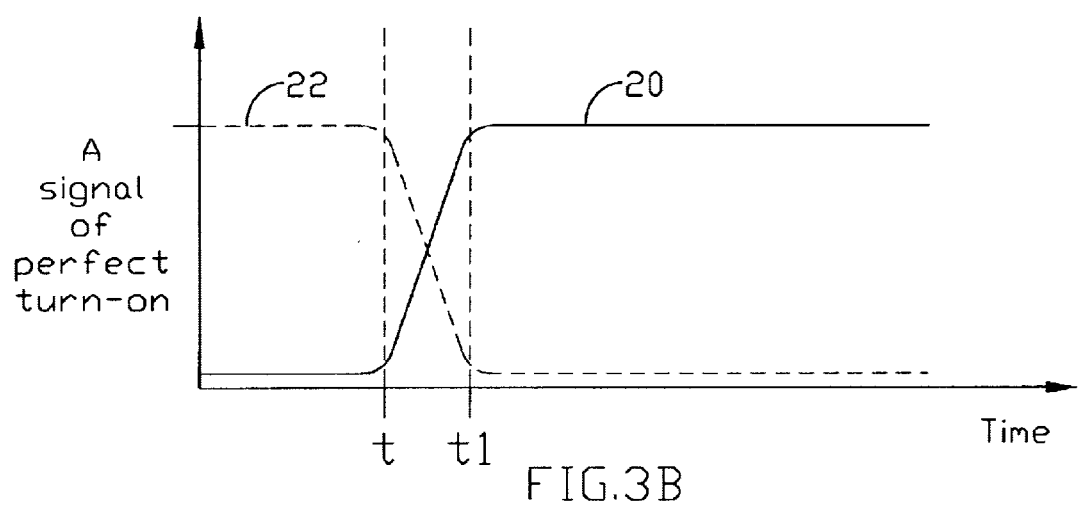
Figure 3C:
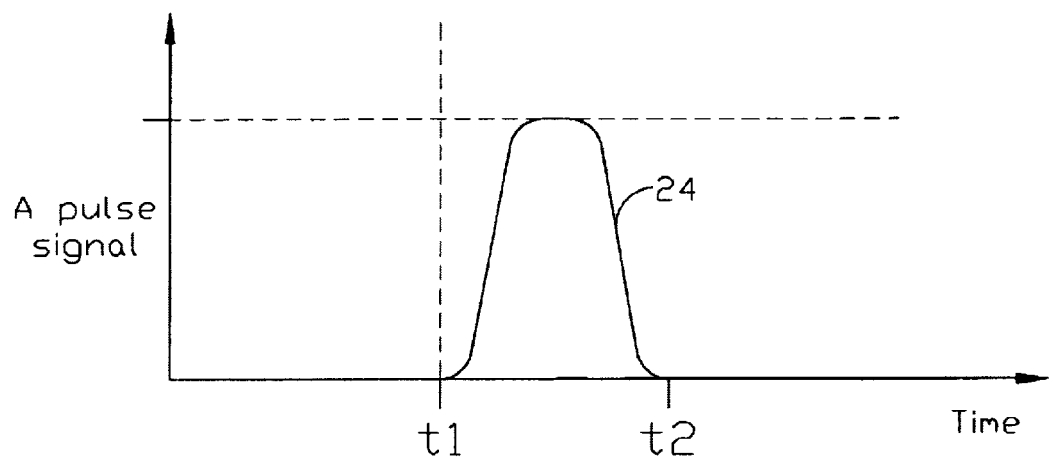

Another preferred embodiment of the present invention employs a turn-on ready signal CHRDY generated when a system turned on, as shown in FIG. 3A, to select a reference voltage as following process. When a system voltage of the system reaches a stable voltage, the signal CHRDY is generated by the system, wherein the signal CHRDY is a signal from a high voltage to a low voltage, as show in the line 20 of FIG. 3B, or a signal from a low voltage to a high voltage, as show in the line 22 of FIG. 3B. A square wave generate circuit 18 provides a pulse signal 24 at the time t1 that the signal CHRDY is generated, as shown in FIG. 3C. The time width of high voltage of the pulse signal is (t2−t1). Compare circuit 12, reference voltage select circuit 14 and boost-divide voltage circuit 16 work during t1 to t2 and a reference voltage $V_{REF}$ is determined by the circuits. When the pulse 24 drop to a low voltage at the time t2, compare circuit 12, reference voltage select circuit 14 and boost-divide voltage circuit 16 turn off. Hence, a narrowest time width of the pulse signal 24 must be equal to or longer than a duration that compare circuit 12, reference voltage select circuit 14 and boost-divide voltage, circuit 16 can complete the process of determining a reference voltage $V_{REF}$. Then, the system continues working and is not influenced any more with compare circuit 12, reference voltage select circuit 14 and boost-divide voltage circuit 16 due to these circuits have turned off.

If compare circuit 12, reference voltage select circuit 14 and boost-divide voltage circuit 16 turn off after pulse 24 drop to a low voltage at the time t2, the consumption power of the circuits can be efficiently economized and the reference voltage $V_{REF}$ does not change after being determined. Therefore, the reference voltage $V_{REF}$ is determined on an initially duration that system turns on for avoiding selecting a wrong reference voltage due to the system yet completely working and interference from system being least.

The aforementioned description is on the basis of the select reference voltage circuit with boost-divide voltage circuit 16. If the select reference voltage circuit works without boost-divide circuit, the process about boost-divide voltage circuit 16 working and turning off leaves out.

Figure 4A:
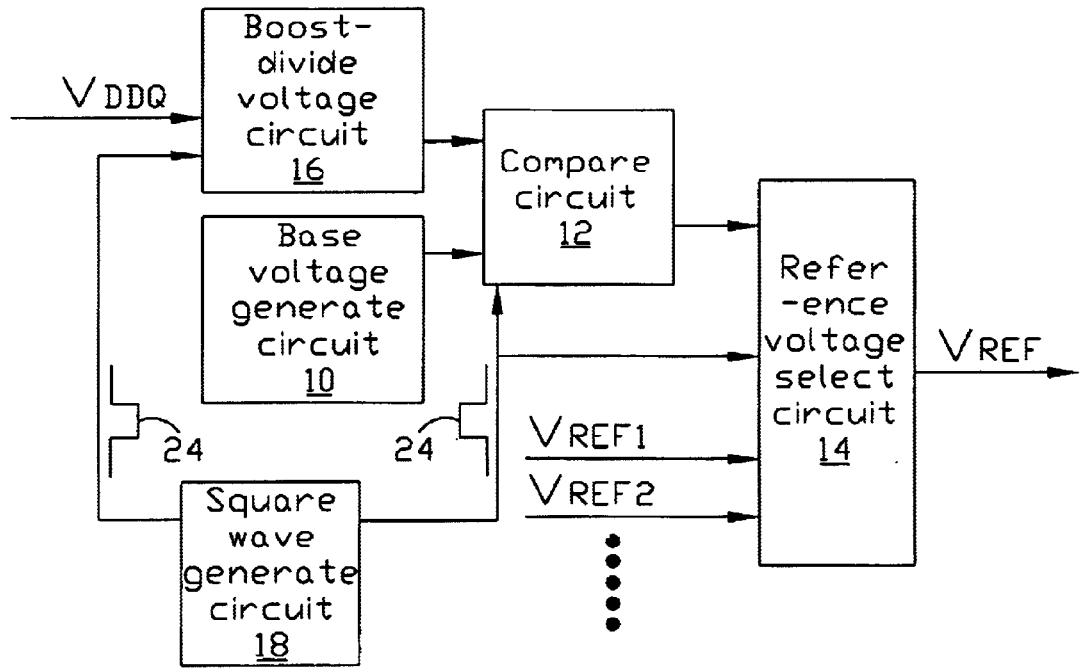
FIG. 4A to FIG. 4B are diagrams of a circuit apparatus of another preferred embodiment in the present invention.
Figure 4B:
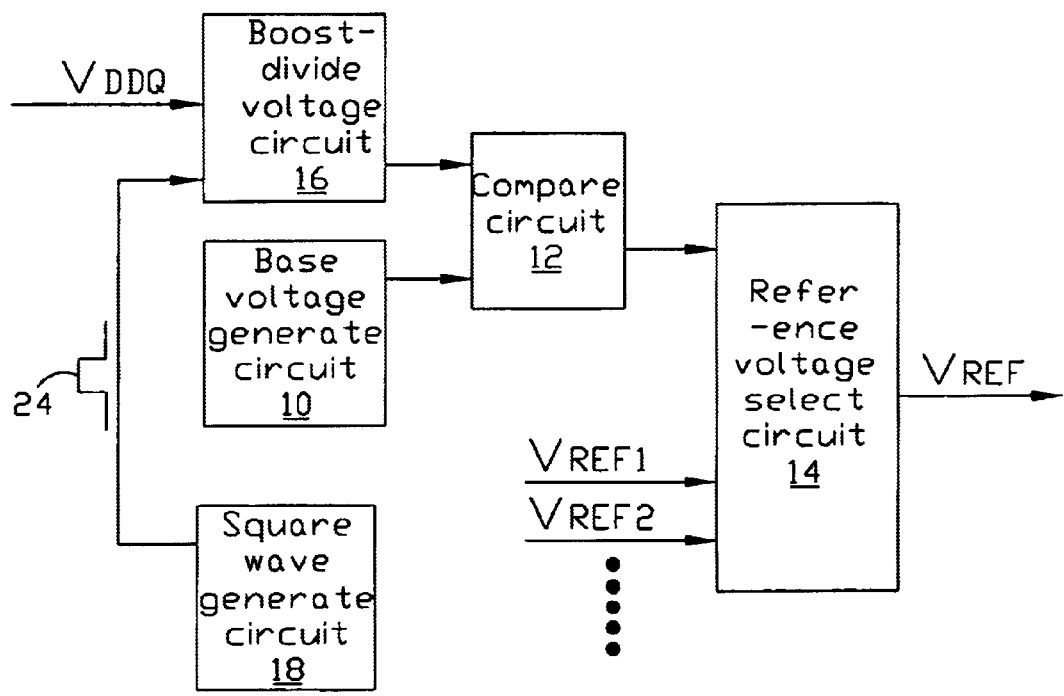

Referring to FIG. 4A and FIG. 4B, the relative position of the boost-divide voltage circuit 16 can be changed according to different conditions, wherein the complete components of the select reference voltage circuit are not drawn in FIG. 4A and FIG. 4B. The pulse signal 24 can respectively couples with compare circuit 12, reference voltage select circuit 14 and boost-divide voltage circuit 16 for shutting respective circuits after the pulse signal 24 drops to a low voltage. The pulse signal 24 may couple with at least one circuit thereof and the circuit is shut after the pulse signal 24 drops to a low voltage. The circuits may be sequentially shut with a mutual coupling signal, e.g.: the compare signal St between compare circuit 12 and reference voltage select circuit 14; the boost-divide voltage $V_{pDDQ}$ or $V_{pBGR}$ between compare circuit 12 and boost-divide voltage circuit 16, etc. For example, when the pulse signal 24 drops to a low voltage, boost-divide voltage circuit 16 is shut and then the boost-divide voltage $V_{pDDQ}$ or $V_{pBGR}$ become 0V. Compare circuit 12 is shut when receiving the 0V of the boost-divide voltage $V_{pDDQ}$ or $V_{pBGR}$. Therefore, the compare signal St follows to become 0V and reference voltage select circuit 14 is shut when receiving the 0V of the compare signal St. Hence, compare circuit 12, reference voltage select circuit 14 and boost-divide voltage circuit 16 are shut after the pulse signal 24 drops to a low voltage.

Accordingly, the another preferred embodiment not only reaches the advantages of the one preferred embodiment, but also reaches the stable and power-saving advantages.

Although specific embodiments have been illustrated and described, it will be obvious to those skilled in the art that various modifications may be made without departing from what is intended to be limited solely by the appended claims.

What is claimed is:

1. A select reference voltage circuit for a logical electrical system, comprising:

a compare circuit receiving a system voltage and a base voltage from said logical electrical system and comparing said system voltage with said base voltage to output a compare signal;

a reference voltage select circuit receiving said compare signal and outputting at least a reference voltage coupling with said compare signal to said logical electrical system; and a square wave generate circuit receiving a turn-on ready signal and generating a pulse signal, wherein said compare circuit and said reference voltage select circuit shutdown when receiving a shutdown signal of said pulse signal dropping to a low voltage.

2. The select reference voltage circuit for a logical electrical system according to claim 1, wherein said compare circuit comprises a plurality of compare voltages that couple with a plurality of logical electrical systems and said select reference voltage circuit outputs a compare signal coupling with one of logical electrical systems said select reference voltage circuit assembled therein.

3. The select reference voltage circuit for a logical electrical system according to claim 1, wherein said reference voltage select circuit comprises a plurality of reference voltages for coupling with a plurality of logical electrical systems and said select reference voltage circuit outputs a compare signal coupling with one of logical electrical systems said select reference voltage circuit assembled therein.

4. The select reference voltage circuit for a logical electrical system according to claim 1 further comprises a boost-divide voltage circuit and said system voltage is generated from said boost-divide voltage circuit.

5. The select reference voltage circuit for a logical electrical system according to claim 4, wherein said boost-divide voltage circuit receives said pulse signal and shutdowns when said pulse signal drops to a low voltage.

6. The select reference voltage circuit for a logical electrical system according to claim 1 further comprises a boost-divide voltage circuit and said base voltage is generated from said second boost-divide voltage circuit.

7. The select reference voltage circuit for a logical electrical system according to claim 5, wherein said boost-divide voltage circuit receives said pulse signal and shutdowns when said pulse signal drops to a low voltage.

8. The select reference voltage circuit for a logical electrical system according to claim 1, wherein said base voltage is 1.2V.

9. The select reference voltage circuit for a logical electrical system according to claim 1, wherein said system voltage is produced by said base voltage through a system circuit.

10. A select reference voltage circuit for a logical electrical system, comprising:

a compare circuit receiving a system voltage and a base voltage from said logical electrical system and comparing said system voltage with said base voltage to output a compare signal; and a reference voltage select circuit receiving said compare signal and outputting at least a reference voltage coupling with said compare signal to said logical electrical system.

11. The select reference voltage circuit for a logical electrical system according to claim 10, wherein said compare circuit comprises a plurality of compare voltages that couple with a plurality of logical electrical systems and said select reference voltage circuit outputs a compare signal coupling with one of logical electrical systems said select reference voltage circuit assembled therein.

12. The select reference voltage circuit for a logical electrical system according to claim 10, wherein said reference voltage select circuit comprises a plurality of reference voltages for coupling with a plurality of logical electrical systems and said select reference voltage circuit outputs a compare signal coupling with one of logical electrical systems said select reference voltage circuit assembled therein.

13. The select reference voltage circuit for a logical electrical system according to claim 10 further comprises a first boost-divide voltage circuit and said system voltage is generated from said boost-divide voltage circuit.

14. The select reference voltage circuit for a logical electrical system according to claim 13 further comprises second boost-divide voltage circuit and said base voltage is generated from said second boost-divide voltage circuit.

15. The select reference voltage circuit for a logical electrical system according to claim 10, wherein said base voltage is 1.2V.

16. The select reference voltage circuit for a logical electrical system according to claim 10 further comprises a boost-divide voltage circuit and said base voltage is generated from said second boost-divide voltage circuit.

17. The select reference voltage circuit for a logical electrical system according to claim 10, wherein said system voltage is produced by said base voltage through a system circuit.

18. A select reference voltage method for a logical electrical system, comprising:

employing a compare circuit to receive a system voltage and a base voltage from said logical electrical system and to compare said system voltage with said base voltage to output a compare signal; and employing a reference voltage select circuit to receive said compare signal and to output at least a reference voltage coupling with said compare signal to said logical electrical system.

19. The select reference voltage method for a logical electrical system according to claim 18, wherein said system voltage is generated from a boost-divide voltage circuit.

20. The select reference voltage method for a logical electrical system according to claim 18, wherein said compare circuit and said reference voltage select circuit shutdown when receiving a shutdown signal of a pulse signal dropping to a low voltage.

21. The select reference voltage method for a logical electrical system according to claim 20, wherein said pulse signal is generated by a square wave generate circuit after receiving a turn-on ready signal.

* * * * *